(12) United States Patent
Green et al.

(10) Patent No.: US 6,756,283 B2
(45) Date of Patent: *Jun. 29, 2004

(54) METHOD OF FABRICATING A HIGH SURFACE AREA CAPACITOR ELECTRODE

(75) Inventors: James E. Green, Caldwell, ID (US); Darwin A. Clampitt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/170,998

(22) Filed: Jun. 13, 2002

(65) Prior Publication Data

US 2002/0151151 A1 Oct. 17, 2002

Related U.S. Application Data

(63) Continuation of application No. 09/465,058, filed on Dec. 16, 1999, now Pat. No. 6,413,831, which is a continuation of application No. 08/833,974, filed on Apr. 11, 1997, now Pat. No. 6,066,539.

(51) Int. Cl.[7] ............................................... H01L 21/20
(52) U.S. Cl. ........................ 438/396; 438/399; 438/253; 438/255
(58) Field of Search ................................. 438/253–255, 438/396–399, 947, 964, 665; 257/306–309, 296–298, 304, 310, 534–538, 774

(56) References Cited

U.S. PATENT DOCUMENTS

| | | |
|---|---|---|
| 5,061,650 A | 10/1991 | Dennison et al. |
| 5,149,676 A | 9/1992 | Kim et al. |
| 5,170,233 A | 12/1992 | Liu et al. |
| 5,254,503 A | 10/1993 | Kenndy |
| 5,256,587 A | 10/1993 | Jun et al. |
| 5,278,091 A | 1/1994 | Fazan et al. |
| 5,292,677 A | 3/1994 | Dennison |
| 5,340,763 A | 8/1994 | Dennison |
| 5,340,765 A | 8/1994 | Dennison et al. |
| 5,342,800 A | 8/1994 | Jun |
| 5,358,888 A | 10/1994 | Ahn et al. |
| 5,362,666 A | 11/1994 | Dennison |
| 5,405,799 A | 4/1995 | Woo et al. |
| 5,407,534 A | 4/1995 | Thakur |
| 5,447,878 A | 9/1995 | Park et al. |
| 5,457,063 A | 10/1995 | Park |
| 5,459,094 A | 10/1995 | Jun |
| 5,491,356 A | 2/1996 | Dennison et al. |
| 5,508,223 A | 4/1996 | Tseng |
| 5,538,592 A | 7/1996 | Chen et al. |
| 5,608,247 A | 3/1997 | Brown |
| 5,612,558 A | 3/1997 | Harshfield |
| 5,616,511 A | 4/1997 | Hirota |
| 5,623,243 A | 4/1997 | Watanabe et al. |
| 5,658,381 A | 8/1997 | Thakur et al. |
| 5,686,747 A | 11/1997 | Jost et al. |
| 5,723,373 A * | 3/1998 | Chang et al. ............... 438/253 |
| 5,744,388 A | 4/1998 | Chen |
| 5,814,549 A | 9/1998 | Wu |
| 5,886,375 A | 3/1999 | Sun |
| 5,959,326 A | 9/1999 | Aiso et al. |
| 6,060,355 A | 5/2000 | Batra et al. |
| 6,066,872 A | 5/2000 | Okada et al. |

* cited by examiner

*Primary Examiner*—Carl Whitehead, Jr.
*Assistant Examiner*—Yennhu B Huynh
(74) *Attorney, Agent, or Firm*—TraskBritt

(57) ABSTRACT

A honeycomb/webbed, high surface area capacitor formed by etching a storage poly using an etch mask having a plurality of micro vias. The etch mask is preferably formed by applying an HSG polysilicon layer on a surface of the storage poly with a mask layer being deposited over the HSG polysilicon layer. An upper portion of the mask layer is removed to expose the uppermost portions of the HSG polysilicon layer and the exposed HSG polysilicon layer portions are then etched, which translates the pattern of the exposed HSG polysilicon layer portions into the storage poly. The capacitor is completed by depositing a dielectric material layer over the storage poly layer and depositing a cell poly layer over the dielectric material layer.

20 Claims, 14 Drawing Sheets

METHOD OF FABRICATING A HIGH SURFACE AREA CAPACITOR ELECTRODE

CROSS-REFERENCE TO RELATED APPLICATIONS

This application is a continuation of application Ser. No. 09/465,058, filed Dec. 16, 1999, now U.S. Pat. No. 6,413,831, issued Jul. 2,2002, which is a continuation of application Ser. No. 08/833,974, filed Apr. 11, 1997, now U.S. Pat. No. 6,066,539, issued May 23, 2000.

BACKGROUND OF THE INVENTION

1. Field of the Invention

The present invention relates to a semiconductor memory device and a method of fabricating same. More particularly, the present invention relates to capacitor fabrication techniques applicable to dynamic random access memories ("DRAMs") capable of achieving an improved degree of integration and a lower number of defects within the DRAM.

2. State of the Art

A widely utilized DRAM (Dynamic Random Access Memory) manufacturing process utilizes CMOS (Complementary Metal Oxide Semiconductor) technology to produce DRAM circuits which comprise an array of unit memory cells, each including one capacitor and one transistor, such as a field effect transistor ("FET"). In the most common circuit designs, one side of the transistor is connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor which charges and discharges circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieved ever-higher degrees of integration which has reduced the size of the DRAM. However, as the dimensions of the DRAM are reduced, the occupied area of each unit memory cell of the DRAM must be reduced. This reduction in occupied area necessarily results in a reduction of the dimensions of the capacitor, which, in turn, makes it difficult to ensure required storage capacitance for transmitting a desired signal without malfunction. However, the ability to densely pack the unit memory cells while maintaining required capacitance levels is a crucial requirement of semiconductor manufacturing technologies if future generations of DRAM devices are to be successfully manufactured.

In order to minimize such a decrease in storage capacitance caused by the reduced occupied area of the capacitor, the capacitor should have a relatively large surface area within the limited region defined on a semiconductor substrate. The drive to produce smaller DRAM circuits has given rise to a great deal of capacitor development. However, for reasons of available capacitance, reliability, and ease of fabrication, most capacitors are stacked capacitors in which the capacitor covers nearly the entire area of a cell and in which vertical portions of the capacitor contribute significantly to the total charge storage capacity. In such designs, the side of the capacitor connected to the transistor is generally called the "storage node" or "storage poly" since the material out of which it is formed is doped polysilicon, while the polysilicon layer defining the side of the capacitor connected to the reference voltage mentioned above is called the "cell poly."

An article by J. H. Ahn et al., entitled "Micro Villus Patterning (MVP) Technology for 256 Mb DRAM Stack Cell," 1992 IEEE, 1992 Symposium on VLSI Technology Digest of Technical Papers, pp. 12–13, hereby incorporated herein by reference, discusses the use of MVP (Micro Villus Patterning) technology for forming a high surface area capacitor. FIGS. 25–28 illustrate cross-sectional views of this technique. FIG. 25 shows a memory cell structure comprising a substrate 202 which has been oxidized to form thick field oxide areas 204 with transistor gate members 206 disposed on the surface of the substrate 202. A barrier layer 208 is disposed over the transistor gate members 206, substrate 202, and field oxide areas 204, and a silicon nitride layer 210 is disposed over the barrier layer 208. A storage poly 212 is disposed on the silicon nitride layer 210 and extends through the silicon nitride layer 210 and the barrier layer 208 and between two transistor gate members 206 to contact the substrate 202. A layer of silicon dioxide 214 is disposed over the storage poly 212.

As shown in FIG. 26, an HSG (Hemispherical-Grain) polysilicon layer 216 is grown on the exposed surfaces of the silicon nitride layer 210, the storage poly 212, and the silicon dioxide layer 214. The structure is then etched using the HSG polysilicon layer 216 as a mask which results in very thin, closely spaced micro villus bars or pins 218, as shown in FIG. 27. The silicon dioxide layer 214 and the silicon nitride layer 210 are then stripped to form the structure shown in FIG. 28. A finalized capacitor would be formed by further processing steps including depositing a dielectric layer on the etched storage poly and depositing a cell poly on the dielectric layer.

Although the MVP technique greatly increases the surface area of the storage poly, a drawback of using the MVP technique is that it can result in splintering problems (or slivers) in the storage node cell poly. As illustrated in FIG. 29, the micro villus bars/pins 218, formed in the method shown in FIGS. 25–28, are thin and fragile such that they are susceptible to splintering that may result in one or more of the micro villus bars/pins (such as pin 220) falling over and shorting to an adjacent storage poly 222, which would render the adjacent storage cells shorted and unusable.

In a 64M DRAM, for example, even if there was only one out of 100,000 cells that had a failure due to a splintered macro villus bar/pin shorting with an adjacent storage cell, it would result in 640 failures or shorts in the DRAM. Generally, there are a limited number of redundant memory cells (usually less than 640 in a 64M DRAM) within a DRAM which are available for use in place of the shorted memory cell. Thus, if the number of failures exceeds the number of redundant memory cells within the DRAM, the DRAM would have to be scrapped.

Therefore, it would be desirable to increase storage cell capacitance by using a technology such as MVP while eliminating polysilicon storage node splintering problems.

BRIEF SUMMARY OF THE INVENTION

The present invention relates to a method of forming a high surface area capacitor, generally used in DRAMs. The present invention takes an opposite approach from the prior art in forming capacitors. Rather than forming bars or pins to increase the surface area, the present invention forms the opposite by etching holes or voids into the storage poly to form a honeycomb or webbed structure. Such a honeycomb/ webbed structure forms a high surface area capacitor without bars or pins which could splinter and short out an adjacent storage cell, as discussed above.

Numerous methods could be employed to achieve the honeycomb structure of the present invention. One such method is a reverse MVP technique wherein an HSG polysilicon layer is grown on the surface of the storage poly and a mask layer is deposited over the HSG polysilicon layer. An upper portion of the mask layer is then removed, forming micro openings to expose the uppermost portions of the HSG polysilicon layer. The exposed HSG polysilicon layer portions are then etched, which translates the pattern of the exposed HSG polysilicon layer portions (which is generally the reverse pattern of the bars or pins which would be formed by the prior art method) into the storage poly. The capacitor is completed by depositing a dielectric material layer over the storage poly layer and depositing a cell poly layer over the dielectric material layer.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
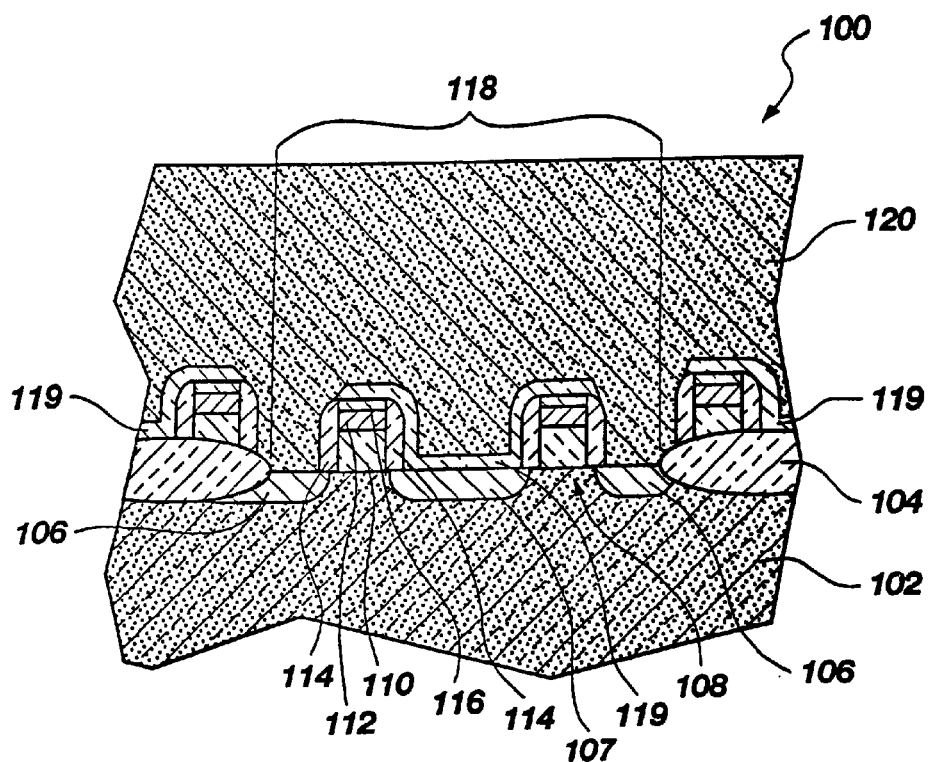
FIGS. 1–10 are side cross-sectional views of a method of forming a memory cell capacitor according to the present invention.

FIGS. 1–10 illustrate a technique according to the present invention for forming a capacitor for a memory cell. It should be understood that the figures presented in conjunction with this description (with the exception of FIGS. 22 and 23) are not meant to be actual cross-sectional views of any particular portion of an actual semiconducting device, but are merely idealized representations which are employed to more clearly and fully depict the process of the invention than would otherwise be possible. FIG. 1 illustrates an intermediate structure 100 in the production of a memory cell. This intermediate structure 100 comprises a semiconductor substrate 102, such as a lightly doped P-type crystal silicon substrate, which has been oxidized to form thick field oxide areas 104 and exposed to implantation processes to form drain regions 106 and source regions 107. Transistor gate members 108 are formed on the surface of the semiconductor substrate 102, including the gate members 108 residing on a substrate active area 118 spanned between the drain regions 106 and the source regions 107. The transistor gate members 108 each comprise a lower buffer layer 110, preferably silicon dioxide, separating a gate conducting layer or word line 112 of the transistor gate member 108 from the semiconductor substrate 102. Transistor insulating spacer members 114, preferably silicon dioxide, are formed on either side of each transistor gate member 108 and a cap insulator 116, also preferably silicon dioxide, is formed on the top of each transistor gate member 108. A barrier layer 119, preferably silicon dioxide, is disposed over the semiconductor substrate 102, the thick field oxide areas 104, and the transistor gate members 108, and etched to expose the drain regions 106 on the semiconductor substrate 102. A storage poly 120, such as a polysilicon material, is deposited over the transistor gate members 108, the semiconductor substrate 102, and the thick field oxide areas 104.

Figure 2:
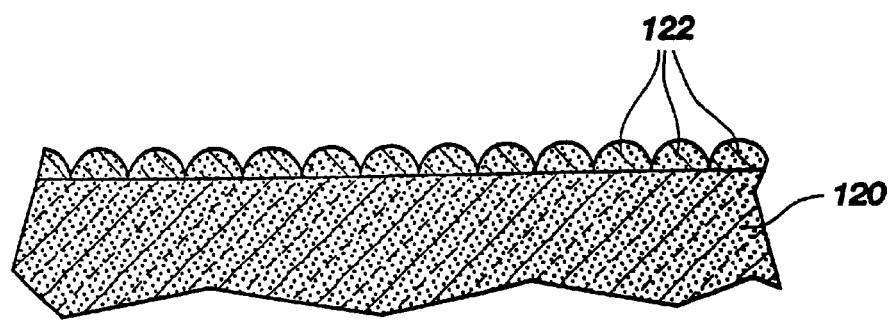

An HSG (HemiSpherical-Grain) polysilicon layer 122 is grown on the surface of the storage poly 120, as shown in FIG. 2 (which is an enlarged view of the surface of the storage poly 120). Preferably, the HSG polysilicon layer 122 is grown by applying a layer of amorphous silicon over the storage poly 120. A polysilicon seed crystal layer is applied at a temperature of at least 500° C., preferably between about 550 and 600° C., and a pressure between about $10^{-7}$ and $10^{-2}$ Torr. The polysilicon seed crystal layer is then annealed at a temperature of at least 500° C., preferably between about 550 and 700° C., and a pressure between about $10^{-7}$ and $10^{-2}$ Torr. The annealing causes the amorphous silicon to nucleate into a polysilicon material around the polysilicon seed crystal to form the HSG polysilicon layer 122. The grain size of the HSG polysilicon should be at least 350 Å, preferably between about 700 and 1000 Å. The HSG polysilicon formation process can be accomplished in batch (multiwafer) or single wafer equipment.

Figure 3:
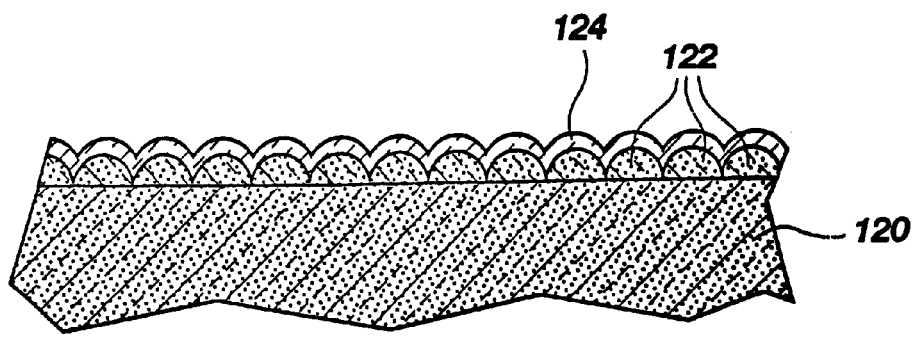
Figure 4:
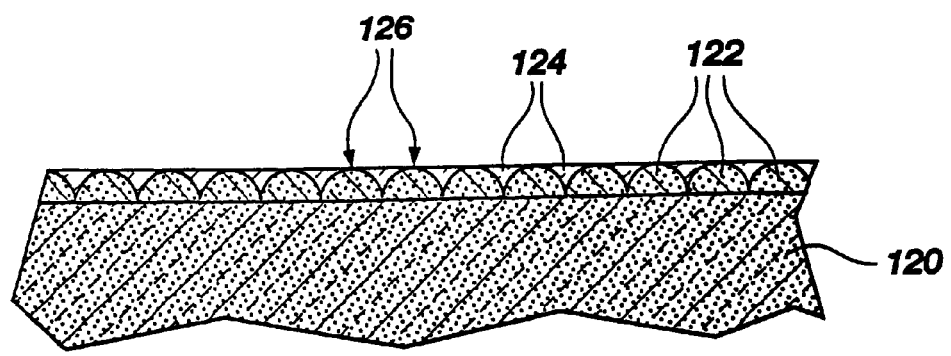
Figure 5:
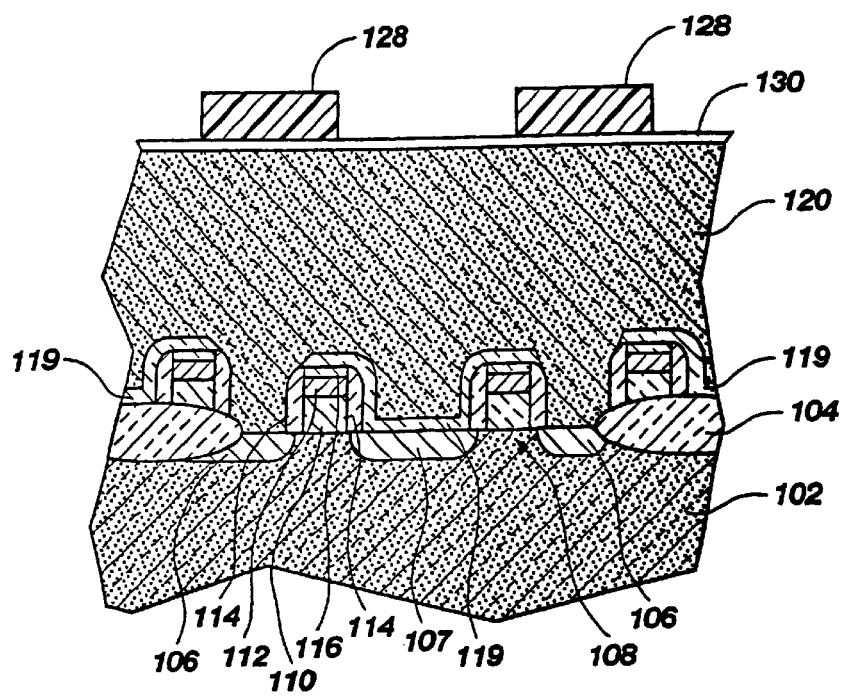

A mask layer 124, preferably silicon dioxide with a thickness of about 350 angstroms, is deposited over the HSG polysilicon layer 122, as shown in FIG. 3. An upper portion of the mask layer 124 is then removed, preferably facet etched (dry etching, sputter etching, and planarization may also be used), to form micro openings to expose the uppermost portions 126 of the HSG polysilicon layer 122, as shown in FIG. 4. Preferably, about 50 to 75% of the HSG polysilicon layer 122 will be exposed. As shown in FIG. 5, a photoresist material 128 is then deposited to pattern a desired position of the memory cell capacitor (the HSG polysilicon layer 122 and the mask layer 124 are shown as a single layer 130).

Figure 6:
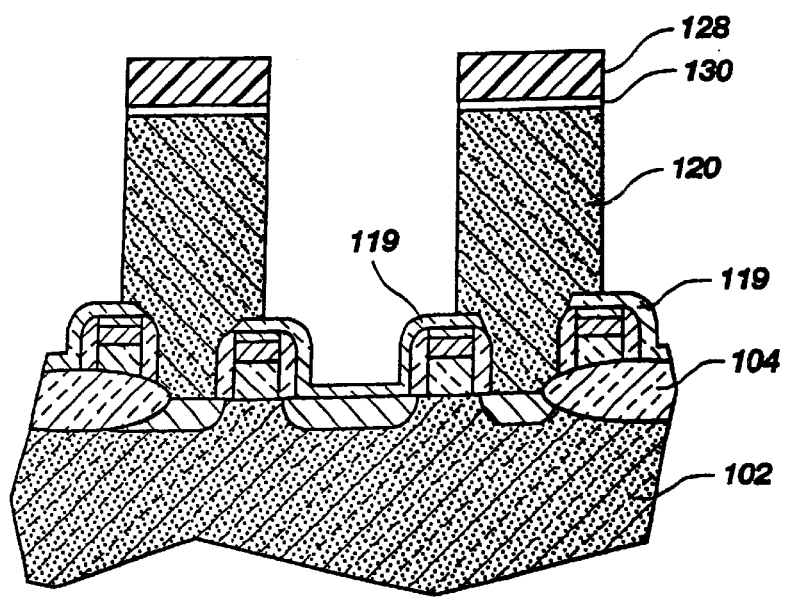
Figure 7:
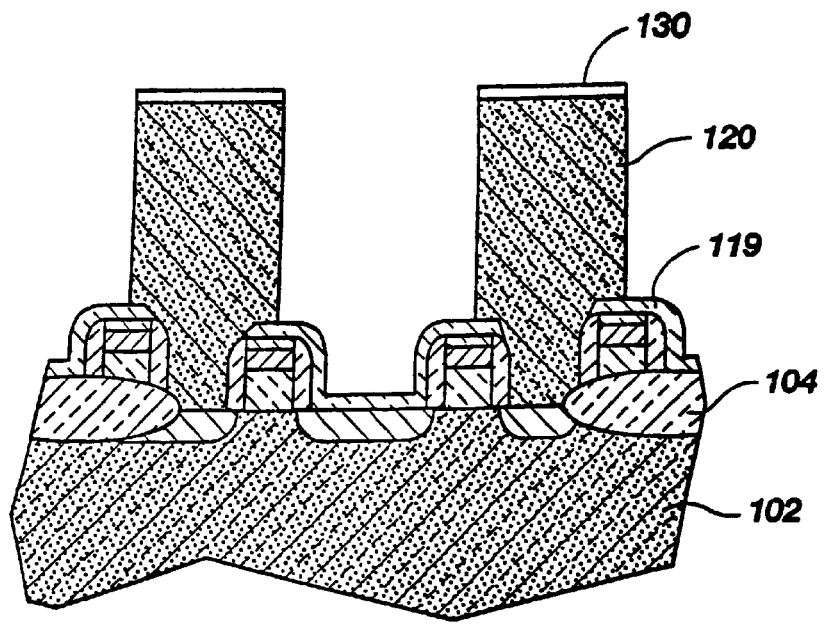

As shown in FIG. 6, a portion of the single layer 130 and a portion of the storage poly 120 are etched to expose a portion of the barrier layer 119 over the source region 107, the thick field oxide 104, and a portion of the gate members 108. The photoresist material 128 is then removed.

Figure 8:
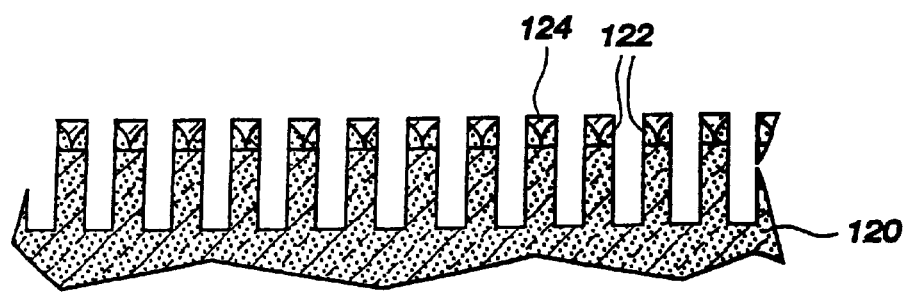
Figure 9:
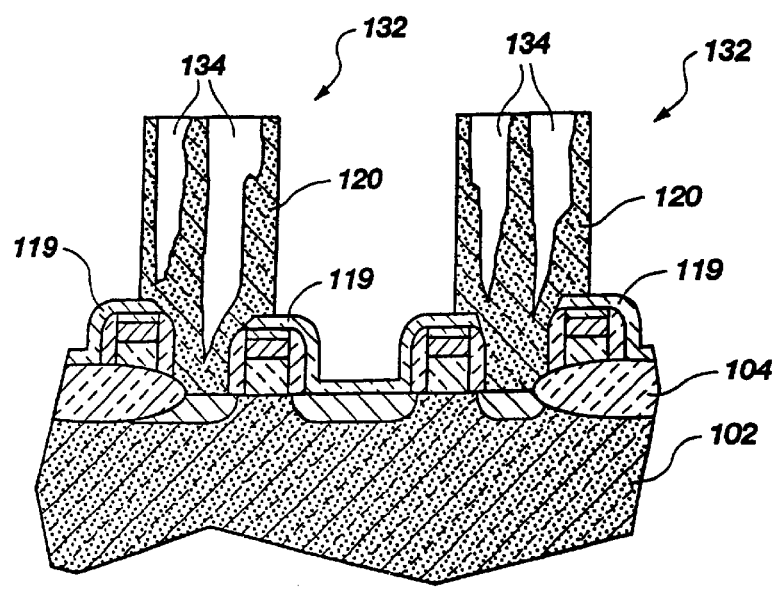

The exposed uppermost HSG polysilicon layer portions 122 are then etched by a dry anisotropic etch, with an etchant which is highly selective to the mask layer 124, preferably selective at a ratio of about 70:1 or higher, as shown in progress in FIG. 8. A preferred selective etch chemistry would contain chlorine gas as the primary etchant with passivation for the barrier layer 119 (silicon dioxide) being hydrogen bromide gas (i.e., the hydrogen bromide prevents the etching of the silicon dioxide barrier layer 119 which, in turn, prevents the source region 107 from being etched). Selective etching is the use of particular etchants which etch only a particular material or materials while being substantially inert to other materials.

Figure 10:
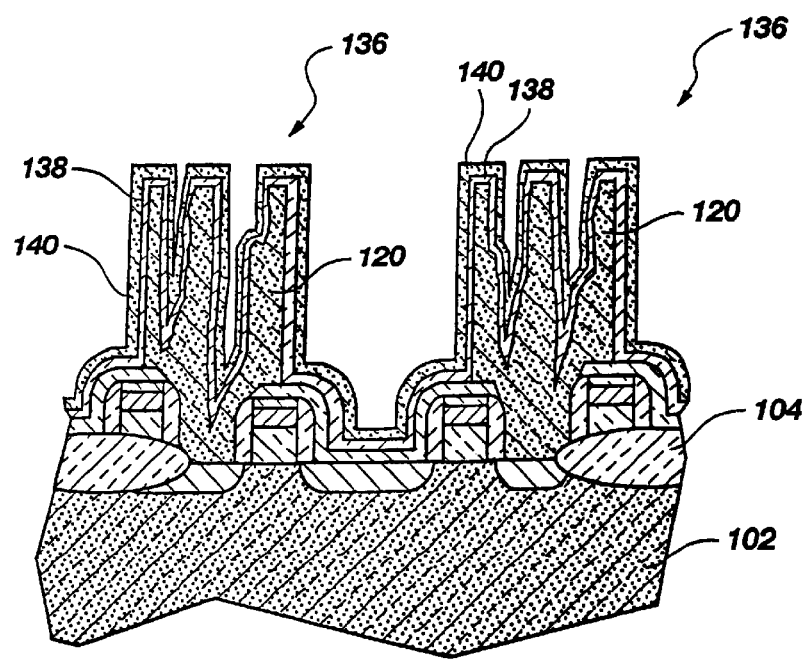

The etching translates the pattern of the exposed uppermost HSG polysilicon layer portions 122 into the storage poly 120. Any remaining mask layer material 124 is then removed, preferably by a wet or in situ etch. The etching of the storage poly 120 results in an etched structure 132 having convoluted openings 134, shown with the convoluted openings 134 greatly exaggerated in FIG. 9. Capacitors 136 are completed by depositing a dielectric material layer 138 over the etched structure 132 and depositing a cell poly layer 140 over the dielectric material layer 138, such as shown in FIG. 10.

Figure 11:
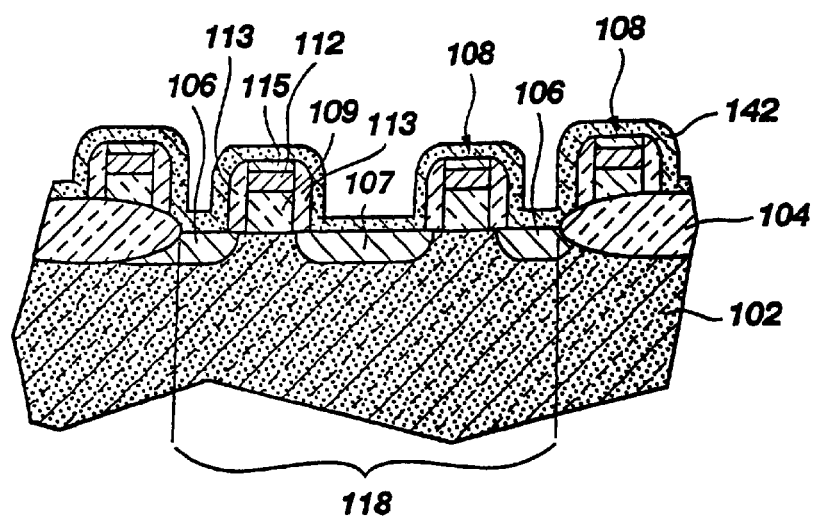
FIGS. 11–21 are side cross-sectional views of an alternate technique of forming a memory cell capacitor according to the present invention.
Figure 12:
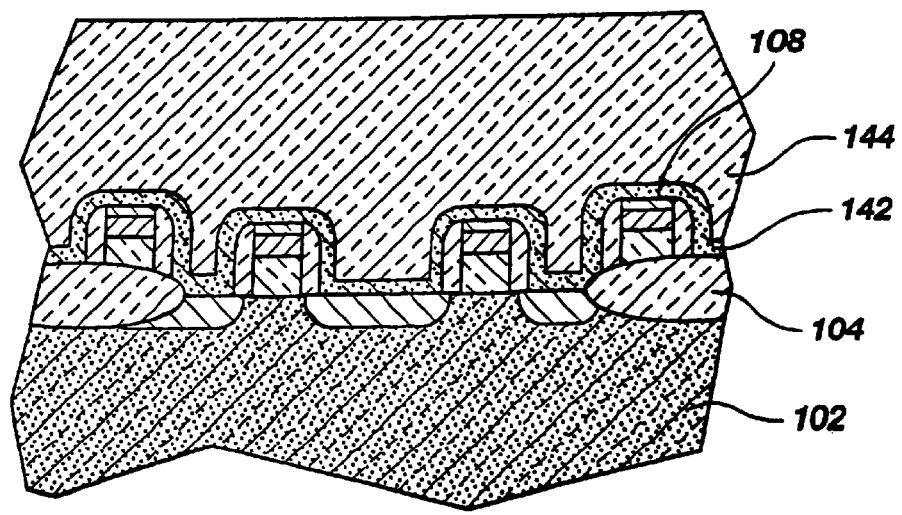

It is, of course, understood that the present invention is not limited to any single technique forming the memory cell capacitor. For example, FIGS. 11–21 illustrate an alternate memory cell capacitor formation technique. Elements common to both FIGS. 1–10 and FIGS. 11–21 retain the same numeric designation. FIG. 11 shows a first barrier layer 142, preferably tetraethyl orthosilicate—TEOS, disposed over the semiconductor substrate 102, the thick field oxide areas 104, and the transistor gate members 108. The transistor gate members 108 each comprise a lower buffer layer 109, preferably silicon dioxide or silicon nitride, separating the gate conducting layer or word line 112 of the transistor gate member 108 from the semiconductor substrate 102. Transistor insulating spacer members 113, made of silicon nitride, are formed on either side of each transistor gate member 108 and a cap insulator 115, also made of silicon nitride, is formed on the top of each transistor gate member 108. Preferably, the gate members 108 residing on the thick field oxide areas 104 abut the active area 118 which will protect the thick field oxide areas 104 during subsequent etching. A second barrier layer 144 (preferably made of borophosphosilicate glass—BPSG, phosphosilicate glass—PSG, or the like) is deposited over the first barrier layer 142, as shown in FIG. 12.

It is, of course, understood that a single barrier layer could be employed. However, a typical barrier configuration is a layer of TEOS over the transistor gate members 108 and the substrate 102 followed by a BPSG layer over the TEOS layer. The TEOS layer is applied to prevent dopant migration. The BPSG layer contains boron and phosphorus which can migrate into the source and drain regions formed on the substrate during inherent device fabrication heating steps. This migration of boron and phosphorus can change the dopant concentrations in the source and drain regions which can adversely affect the performance of the memory cell.

Figure 13:
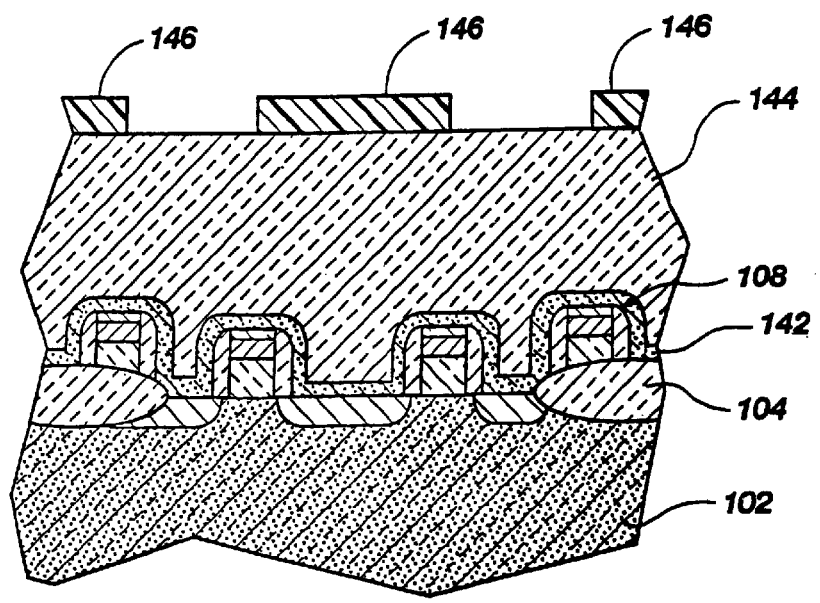
Figure 14:
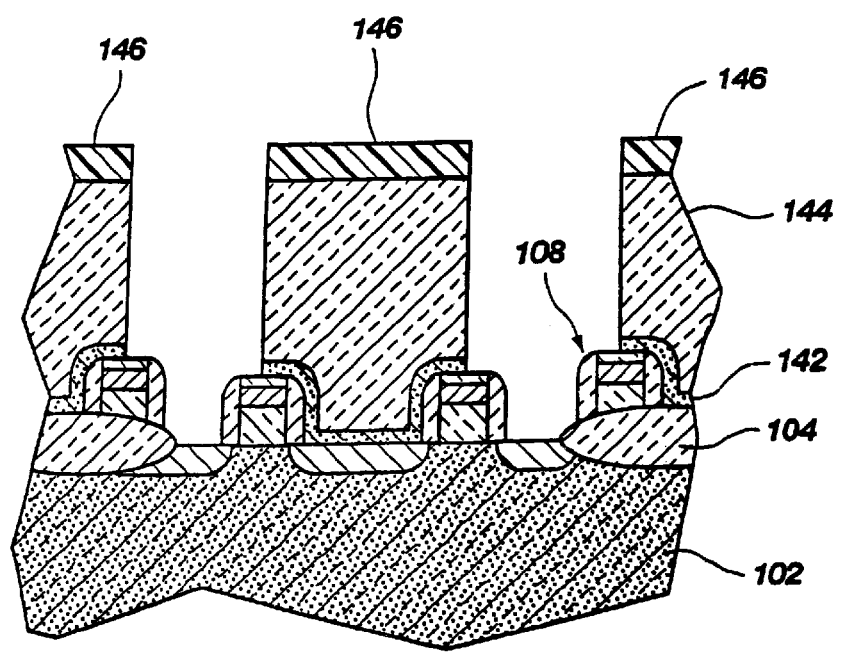
Figure 15:
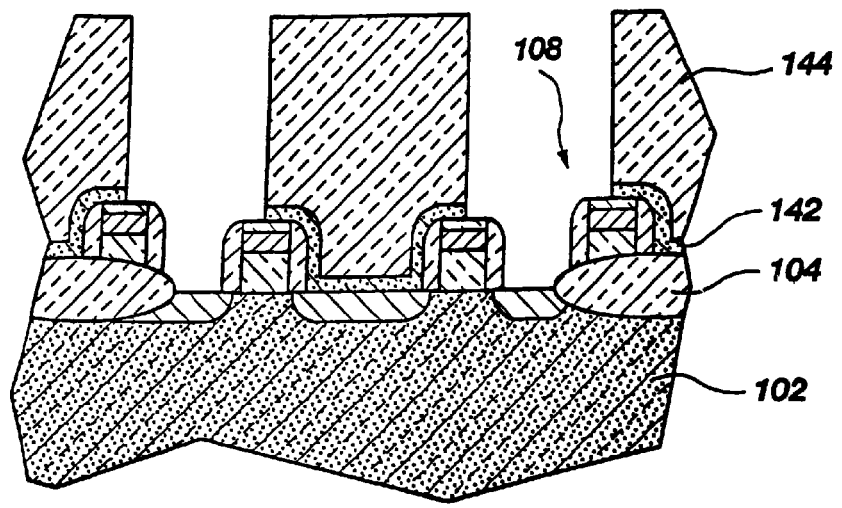
Figure 16:
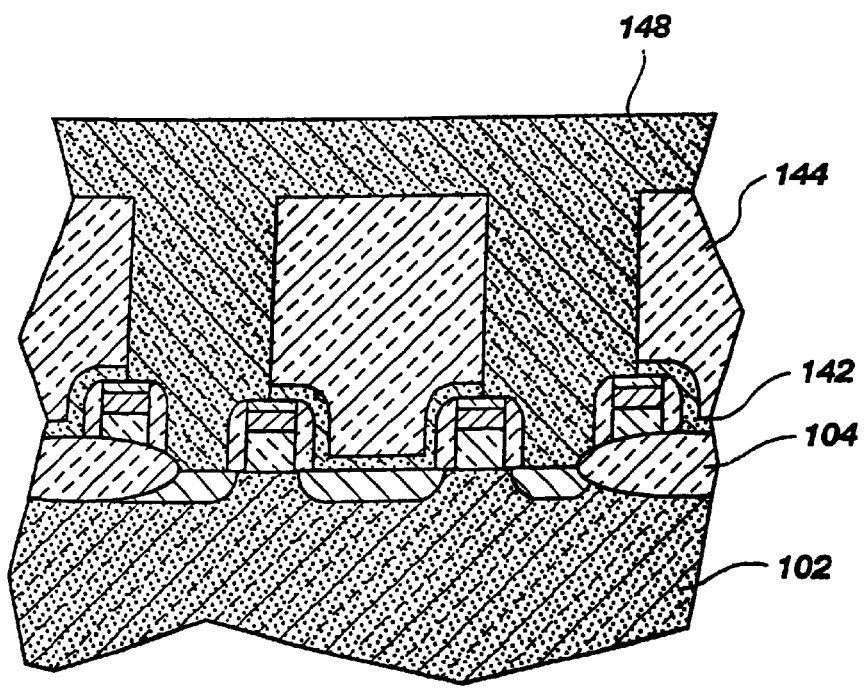
Figure 17:
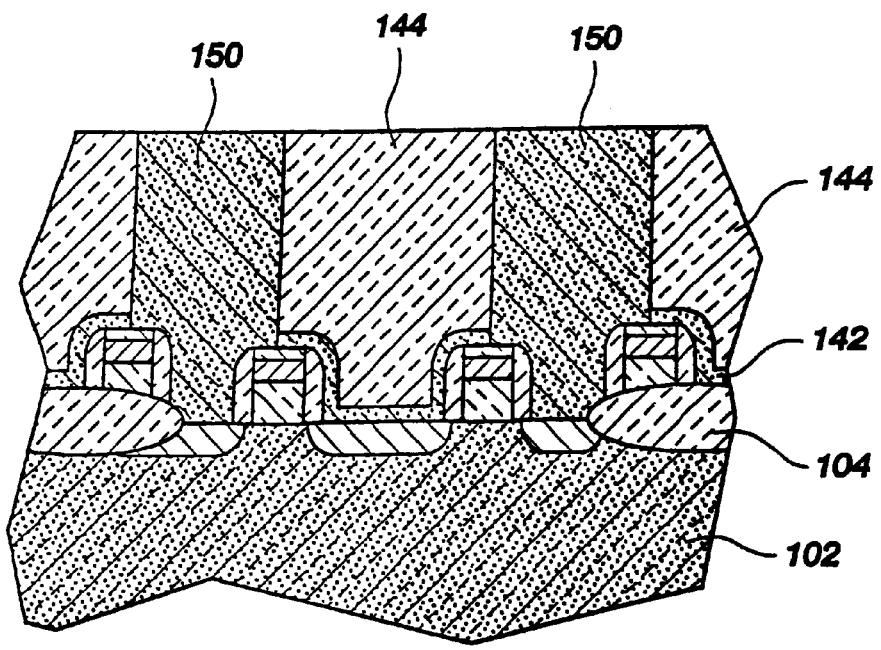

As shown in FIG. 13, a resist material 146 is patterned on the second barrier layer 144, such that predetermined areas of the memory cell capacitor formation will be etched. The second barrier layer 144 and the first barrier layer 142 are etched to expose a portion of the semiconductor substrate 102, as shown in FIG. 14. The transistor insulating spacer members 113 and the cap insulator 115 each being made of silicon nitride resists the etchant and thus prevents shorting between the word line 112 and the capacitor to be formed. The resist material 146 is then removed, as shown in FIG. 15, and a layer of amorphous silicon 148, which upon subsequent annealing will become polysilicon, is then applied over second barrier layer 144 to make contact with the semiconductor substrate 102, as shown in FIG. 16. The amorphous silicon layer 148 is then planarized down to the second barrier layer 144 to form silicon plugs 150, as shown in FIG 17. The planarization is preferably performed using a mechanical abrasion, such as a chemical mechanical planarization (CMP) process.

Figure 18:
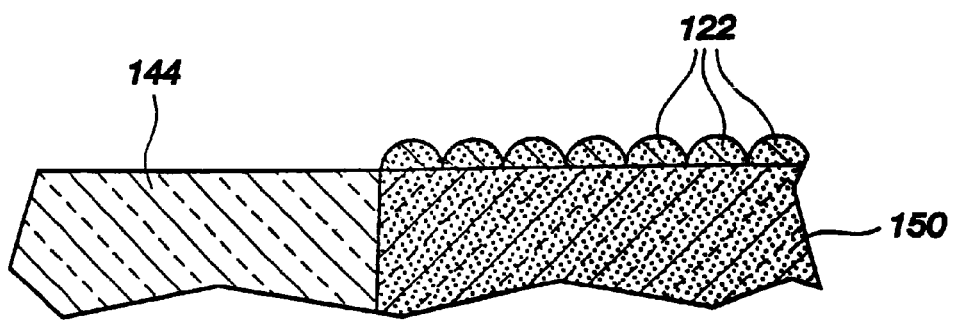
Figure 19:
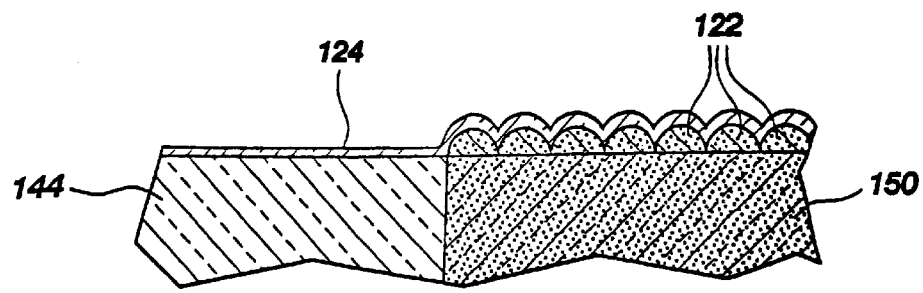

An HSG polysilicon layer 122 is selectively grown on the surface of the silicon plugs 150, as shown in FIG. 18. The selective growth of the HSG polysilicon layer 122 is preferably achieved by applying a polysilicon seed crystal layer over the second barrier layer 144 and the silicon plugs 150. The polysilicon seed crystal layer is applied at a temperature of at least 500° C., preferably between about 550 and 600° C., and a pressure between about $10^{-7}$ and $10^{-2}$ Torr. The polysilicon seed crystal layer is then annealed at a temperature of at least 500° C., preferably between about 550 and 700° C., and a pressure between about $10^{-7}$ and $10^{-2}$ Torr. The selectivity of growth of the HSG polysilicon layer 122 is due to the difference in incubation times required to seed nucleation sites for the HSG polysilicon layer 122 on the silicon plugs 150 (amorphous silicon) and the second barrier layer 144. The HSG nucleation sites form more quickly on the silicon plugs 150 than on the second barrier layer 144. Thus, the HSG polysilicon growth can be completed on the silicon plugs 150 and the formation halted prior to the formation of HSG polysilicon on the second barrier layer 144.

Figure 20:
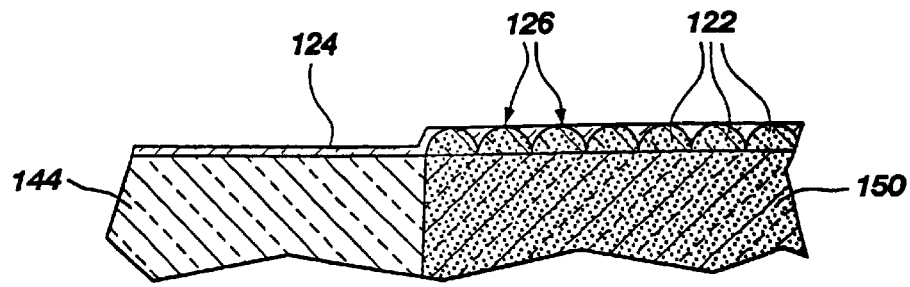
Figure 21:
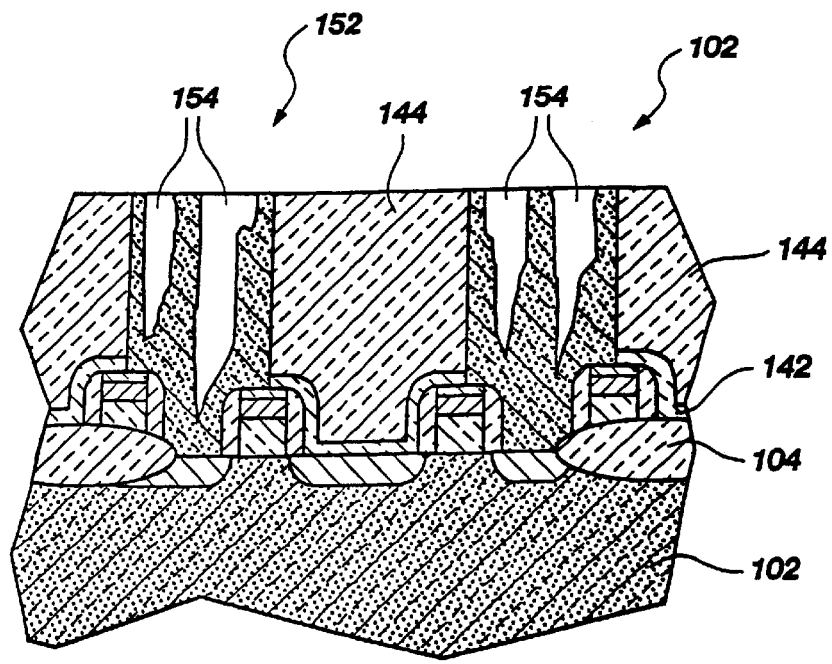

A mask layer 124 is deposited over the HSG polysilicon layer 122. The upper portion of the mask layer 124 is then removed to expose the uppermost portions 126 of the HSG polysilicon layer 122, as shown in FIG. 20. The exposed HSG polysilicon layer portions 126 are then etched, as previously shown in FIG. 8. The etching of the silicon plugs 150 results in an etched structure 152 having convoluted openings 154, shown with the convoluted openings 154 greatly exaggerated in FIG. 21. The memory cell capacitors are completed by depositing a dielectric material layer over the etched structure 152 and depositing a cell poly layer over the dielectric material layer, as previously described for FIG. 10.

Figure 22:
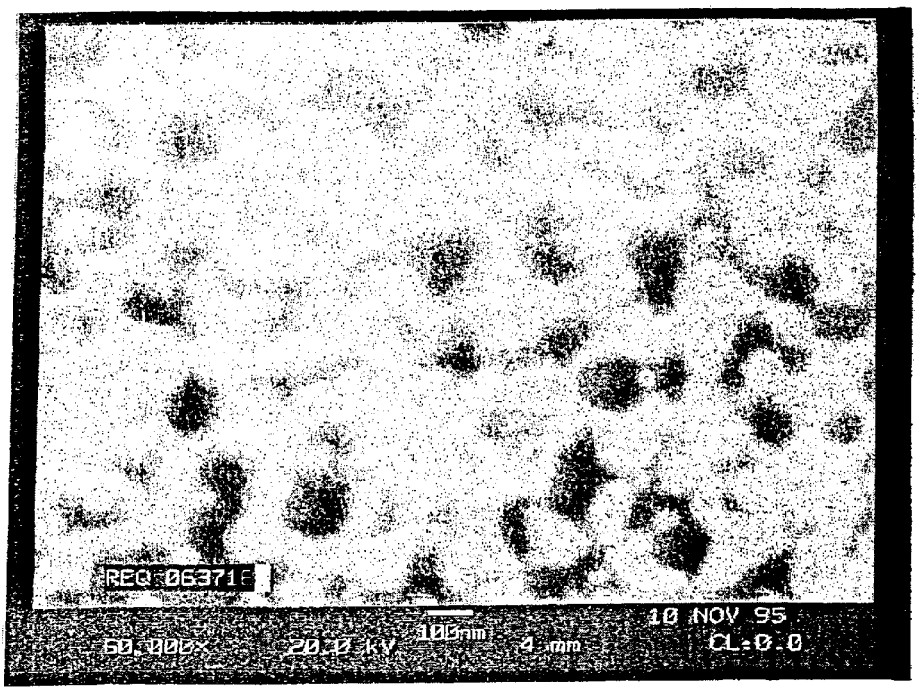
FIG. 22 is an illustration of a scanning electron micrograph of an oblique view of a storage poly after etching in the formation of a capacitor according to the present invention.

The method of the present invention results in a unique honeycomb storage poly structure such that the storage poly has a highly webbed structure rather than free standing micro villus bar/pin structures, as discussed above. This webbed structure is essentially a substantially continuous, convoluted, maze-like structure defined by a plurality of interconnected wells extending in various directions in the X-Y plane. In other words, the maze-like structure extends in the X, Y, and Z coordinates, rather than essentially only in the Z coordinate in which a freestanding micro villus bar/pin structure with limited extent in the X-Y plane would essentially only exist. An exemplary illustration of a typical pattern in the X-Y plane is shown in FIG. 22. FIG. 22 is an illustration of a scanning electron micrograph, top view, of the etched structure 132 or 152 after etching same and after removal of any remaining mask layer material 124. As FIG. 22 illustrates, the etched structure 132, 152 is highly integrated/webbed. Another way to visualize the resulting etched structure 152 is in terms of convoluted openings 154 of canyons, or holes, between the remainder of etched structure 152, which is also referred to herein as interconnected mesas 152 or ridges 152 and which defines a convoluted topography.

Figure 23:
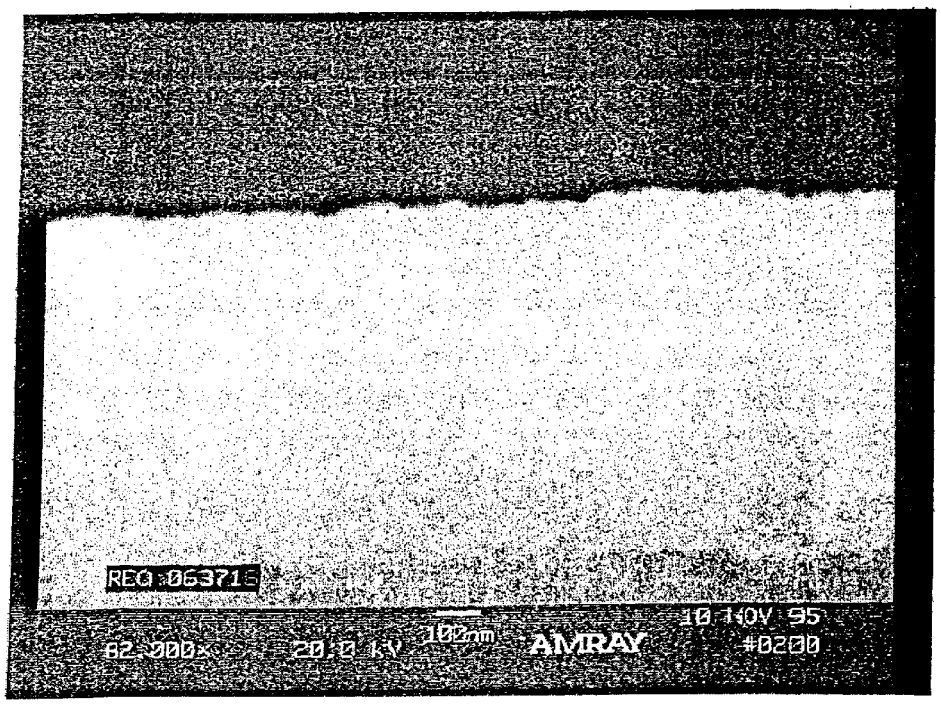
FIG. 23 is an illustration of a scanning electron micrograph of a side cross-sectional view of a storage poly after etching in the formation of a capacitor according to the present invention.
Figure 24:
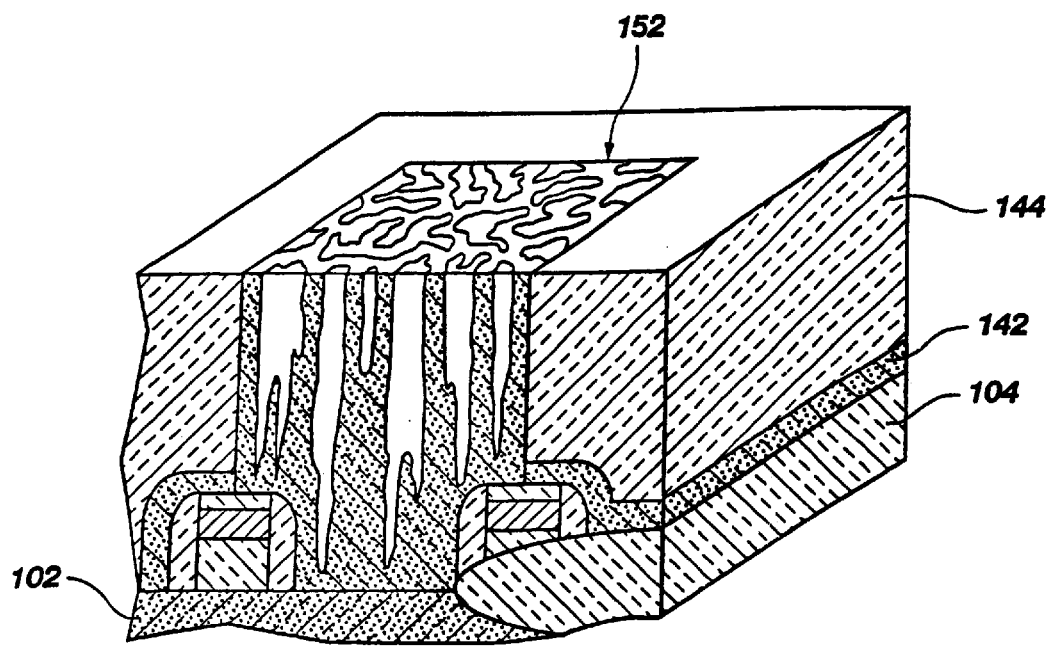
FIG. 24 illustrates an oblique, cross-sectional view of FIG. 21.
Figure 25:
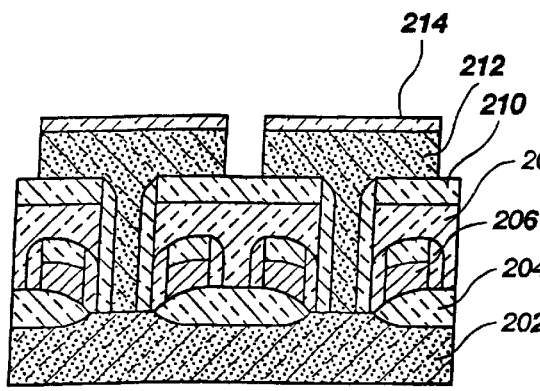
FIGS. 25–28 are side cross-sectional views of a prior art MVP technique of forming a capacitor.
Figure 26:
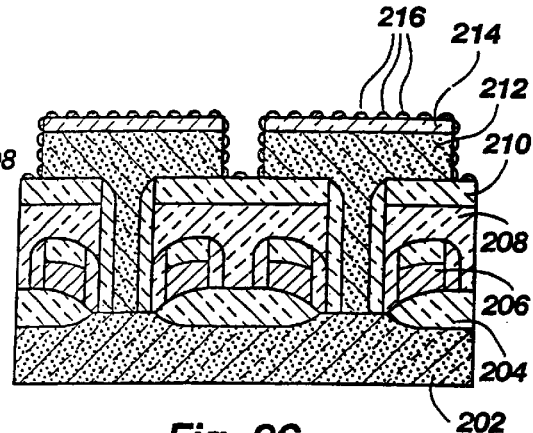
Figure 27:
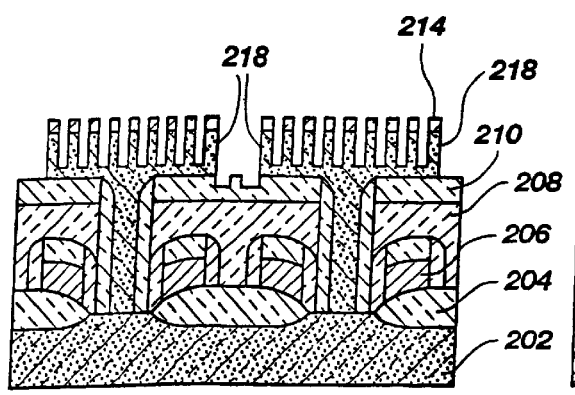
Figure 28:
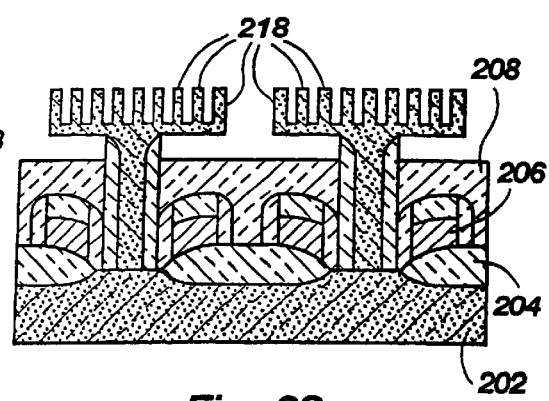
Figure 29:
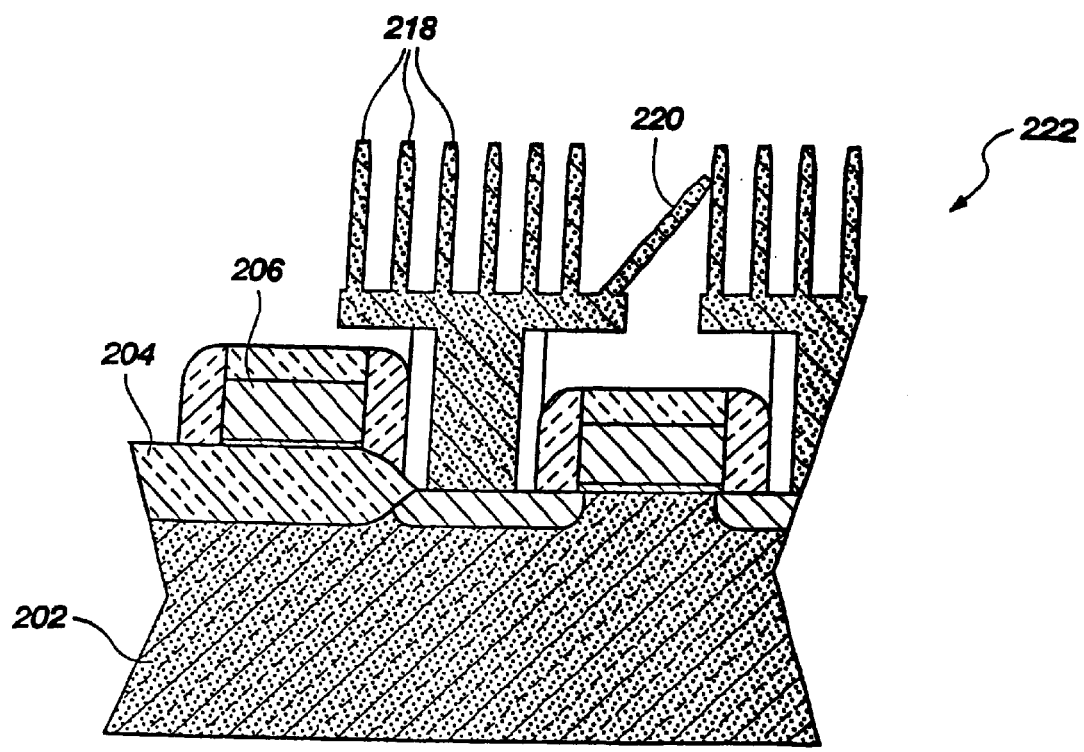
FIG. 29 is a side cross-sectional view of a prior art capacitor formed by an MVP technique which illustrates the problem of storage node splintering.

The integrated/webbed structure of the storage poly 120 in the X and Z coordinate is shown in FIG. 23. FIG. 23 is an illustration of a scanning electron micrograph, side cross-sectional view, of the storage poly. FIG. 24 illustrates an oblique, cross-sectional view of the etched structure 152 of FIG. 21. This maze-like webbed structure is substantially self-buttressing. In other words, the convoluted and webbed shape forms a strong structure which allows the capacitor to withstand forces which would otherwise splinter a micro villus pinibar capacitor.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method for fabricating a high surface area capacitor, comprising:
    forming a polysilicon layer having a nonplanar surface over a conductive structure from which a bottom electrode of the capacitor is to be formed;
    applying a mask material over at least low-elevation portions of said polysilicon layer;
    removing portions of said mask material located over higher-elevation portions of said polysilicon layer to expose regions of said polysilicon layer through said mask material in at least one convoluted configuration, other portions of said mask material overlying at least some low elevation portions of said polysilicon layer remaining following said removing; and
    etching through said regions and into said conductive structure.

2. The method of claim 1, further comprising:
    depositing photoresist over said polysilicon layer and said mask material, at least portions of said polysilicon layer and said mask material being exposed through said photoresist;
    etching said portions through said photoresist; and
    removing said photoresist prior to said etching through said regions.

3. The method of claim 1, further comprising:
    depositing a buffer layer on a semiconductor substrate;
    patterning a photomask on said buffer layer;
    etching said buffer layer through said photomask to expose portions of said semiconductor substrate, including at least one active-device region thereof;
    removeing said photomask;
    applying a layer comprising conductive material over said semiconductor substrate and in contact with said exposed portions thereof; and
    planarizing said layer comprising conductive material so as to expose said buffer layer therethrough and to form said conductive structure.

4. The method of claim 3, wherein said planarizing comprises mechanically abrading said layer comprising conductive material.

5. The method of claim 4, wherein said mechanically abrading comprises chemical mechanical planarization.

6. The method of claim 1, wherein said forming said polysilicon layer comprises forming a hemispherical-grain polysilicon layer.

7. The method of claim 1, wherein said etching through said regions of said polysilicon layer and into said conductive structure includes forming at least one mesa.

8. The method of claim 7, wherein said forming said at least one mesa comprises forming a plurality of contiguous mesas extending in the X, Y and Z coordinates.

9. The method of claim 1, wherein said etching through said regions of said polysilicon layer and into said conductive structure includes forming at least one web.

10. the method of claim 9, wherein said etching through said regions of said polysilicon layer and into said conductive structure includes forming said at least one web to extend in the X, Y and Z coordinates.

11. The method of claim 1, further comprising:
    removing portions of said mask material located over higher-elevation portions of said polysilicon layer.

12. The method of claim 11, wherein said removing comprises at least one of planarization and etching.

13. The method of claim 12, wherein said etching comprises at least one of facet etching, dry etching, and sputter etching.

14. The method of claim 1, wherein said applying said mask material comprises applying a silicon oxide over said at least low-elevation portions of said polysilicon layer.

15. The method of claim 14, wherein said applying said silicon oxide comprises applying said silicon oxide to a thickness of about 350 Å.

16. The method of claim 11, wherein said removing comprises exposing about 50% to about 75% of an area occupied by said polysilicon layer.

17. The method of claim 1, further comprising:
    disposing dielectric material over said bottom electrode.

18. The method of claim 17, further comprising:
    disposing an upper electrode over said dielectric material.

19. A method for fabricating a high surface area capacitor, comprising:
    forming a polysilicon layer having a nonplanar surface over a conductive structure from which a bottom electrode of the capacitor is to be formed;
    applying a mask material over at least low-elevation portions of said polysilicon layer;
    selectively removing higher-elevation portions of said mask material over said polysilicon layer without substantially removing lower elevation portions of said mask material located over said polysilicon layer to expose regions of said polysilicon layer in at least one convoluted configuration; and
    etching through said regions and into said conductive structure.

20. The method of claim 19, wherein said selectively removing comprises facet etching or planarizing said higher-elevation portions of said mask material.

* * * * *